United States Patent
Volland et al.

(10) Patent No.: US 11,262,393 B2
(45) Date of Patent: Mar. 1, 2022

(54) METHOD FOR DETERMINING THE RESISTANCE TEMPERATURE CHARACTERISTIC OF A CERAMIC GLOW PLUG

(71) Applicant: BorgWarner Ludwigsburg GmbH, Ludwigsburg (DE)

(72) Inventors: Karsten Volland, Ludwigsburg (DE); Karen Gonzalez, Filderstadt (DE); Jörg Stöckle, Ludwigsburg (DE); Andreas Klingebiel, Marbach am Neckar (DE)

(73) Assignee: BorgWarner Ludwigsburg GmbH, Ludwigsburg (DE)

( * ) Notice: Subject to any disclaimer, the term of this patent is extended or adjusted under 35 U.S.C. 154(b) by 26 days.

(21) Appl. No.: 16/825,753

(22) Filed: Mar. 20, 2020

(65) Prior Publication Data
US 2020/0319235 A1 Oct. 8, 2020

(30) Foreign Application Priority Data

Apr. 3, 2019 (DE) ...................... 10 2019 108 688.4

(51) Int. Cl.
| | |
|---|---|
| *G01R 27/08* | (2006.01) |
| *G01R 27/02* | (2006.01) |
| *F02P 17/00* | (2006.01) |
| *G01R 17/10* | (2006.01) |
| *G01R 27/14* | (2006.01) |
| *G01R 27/26* | (2006.01) |
| *G01R 31/28* | (2006.01) |

(52) U.S. Cl.
CPC .............. *G01R 27/02* (2013.01); *F02P 17/00* (2013.01); *G01R 17/105* (2013.01); *G01R 27/14* (2013.01); *G01R 27/2635* (2013.01); *G01R 31/2831* (2013.01); *G01R 31/2858* (2013.01); *H01L 2224/48091* (2013.01); *H01L 2924/00014* (2013.01)

(58) Field of Classification Search
CPC ...... G01R 27/02; G01R 17/105; G01R 27/14; G01R 27/2635; G01R 31/2831; G01R 31/2858; H01L 2224/48091; H01L 2924/00014; F02P 17/00; F02P 19/027; F23Q 7/001

USPC .......... 324/76.11–76.83, 439, 459, 549, 600, 324/649, 691, 702, 703
See application file for complete search history.

(56) References Cited

U.S. PATENT DOCUMENTS

| | | | |
|---|---|---|---|
| 7,886,587 B2 | 2/2011 | Moritz et al. | |
| 8,826,729 B2 | 9/2014 | Moritz et al. | |
| 9,567,968 B2 | 2/2017 | Bleil et al. | |
| 2007/0056545 A1* | 3/2007 | Kernwein | F02P 19/027 123/145 A |
| 2009/0179026 A1 | 7/2009 | Morita et al. | |
| 2013/0228007 A1 | 9/2013 | Moritz et al. | |
| 2014/0338626 A1 | 11/2014 | Fulton | |
| 2015/0042344 A1 | 2/2015 | Bleil et al. | |
| 2018/0313319 A1* | 11/2018 | Bleil | F02P 19/025 |
| 2019/0017488 A1* | 1/2019 | Stockle | F02P 19/028 |
| 2020/0284691 A1* | 9/2020 | Gonzalez | F02P 19/026 |

FOREIGN PATENT DOCUMENTS

| | | |
|---|---|---|
| DE | 10 2009 000 232 A1 | 7/2009 |
| DE | 10 2010 040 682 A1 | 3/2012 |
| DE | 10 2012 101 999 A1 | 9/2013 |
| DE | 10 2014 106 859 A1 | 11/2014 |
| DE | 10 2013 108 628 B4 | 4/2017 |
| EP | 2 290 224 A2 | 3/2011 |
| JP | 2005-240707 A | 9/2005 |

* cited by examiner

Primary Examiner — Raul J Rios Russo
(74) Attorney, Agent, or Firm — Bose McKinney & Evans LLP

(57) ABSTRACT

A method is described for determining the resistance temperature characteristic of a ceramic glow plug, wherein the glow plug is heated at a specified power, wherein before the heating it is first determined whether the glow plug is an aged glow plug, and then, if the glow plug has not been detected as an aged glow plug, the glow plug is heated at a first specified power and the resistance value thereby achieved is assigned to a temperature that is anticipated to be the final temperature when heating a factory-outlet glow plug at this first power, or if the glow plug has been detected as an aged glow plug, the glow plug is heated at a reduced power which is smaller than the first power, and the resistance value achieved thereby is assigned to the same temperature that is also anticipated when heating a factory-outlet glow plug at the first power.

6 Claims, No Drawings

METHOD FOR DETERMINING THE RESISTANCE TEMPERATURE CHARACTERISTIC OF A CERAMIC GLOW PLUG

RELATED APPLICATIONS

This application claims priority to DE 10 2019 108 688.4, filed Apr. 3, 2019, the entire disclosure of which is hereby incorporated herein by reference.

BACKGROUND

This disclosure teaches a method for determining the resistance temperature characteristic of a ceramic glow plug.

Glow plugs are regulated to a setpoint temperature by a modern control system. For this purpose, a setpoint resistance is determined from the setpoint temperature by means of a resistance temperature characteristic, and the actual resistance of the glow plug is then regulated to the setpoint resistance by closed loop control. In other words, a setpoint value of the electrical resistance is associated with a setpoint value of the temperature by means of a resistance temperature characteristic, and the supply of electrical power to the glow plug is regulated such that the electrical resistance and the temperature associated with it are brought into accordance with the setpoint value of the electrical resistance, that is to say, with the setpoint value of the temperature. The quality of the temperature regulation is limited by the accuracy of the resistance temperature characteristic. It is therefore important to know the resistance temperature characteristic of the glow plug that is being used as precisely as possible.

The resistance temperature characteristic is subject to a high variance due to the production process, with the result that the resistance temperature characteristic must be individually determined for each ceramic glow plug.

A common way of determining the resistance temperature characteristic of a glow plug is to maintain the engine in a stationary state for some time, and then to heat the glow plug for a specified time, e.g., about one minute, with a constant specified electrical power, until the glow plug reaches a state of equilibrium, the temperature of which is defined by the heat output and the heat dissipation while the engine is stationary, and is therefore known, or can be determined by appropriate measurements, for all future cases.

This procedure is based on the fact that the heat capacity of a glow plug is only subject to a relatively small variance compared to its electrical resistance. Therefore, by supplying a specified power, factory-outlet plugs are heated relatively precisely to the same temperature. The manufacturer of the glow plugs can determine this final temperature associated with a given power for each build series by appropriate measurements and tests.

Modern control systems usually have options for detecting a plug replacement, so that the resistance temperature characteristic of a glow plug can be determined a new if necessary. Such methods are of known art, for example, from DE 10 2013 108 628 B4, DE 10 2010 040 682 A1 and U.S. Pat. No. 7,886,587 B2.

SUMMARY

This disclosure demonstrates a way in which the resistance temperature characteristic of a glow plug can be determined with higher accuracy.

This disclosure is based on the knowledge that the electrical resistance of a ceramic glow plug increases with increasing ageing. This increase in the overall resistance is essentially due to an increase in the electrical resistance at the glow plug tip, that is to say, at the point of transition between a forward conductor and a return conductor. As a result of this increase in resistance in the region of the glow plug tip, an increasingly larger proportion of the electrical heating power is dissipated directly at the glow plug tip in the case of an the ageing glow plug, so that an ever higher temperature is reached there, even when the power consumption of the glow plug remains the same.

The displacement of the resistance temperature characteristic curve with progressive ageing of the glow plug can lead to the fact that a resistance temperature characteristic curve originally determined at the new factory condition is no longer valid after some time. If it is recognized that a resistance temperature characteristic curve available for an engine cylinder no longer matches the glow plug mounted on this engine cylinder, the resistance temperature characteristic curve for the glow plug concerned must be re-determined. In accordance with this disclosure, a glow plug detected as aged is treated in a different manner from a factory-outlet glow plug, or a glow plug that is not detected as aged.

While a specified first power, e.g., 33 W, is supplied to a factory-outlet glow plug for a specified period of time, only a reduced power, e.g., 30 W, is supplied to a glow plug that has been detected as aged. The resistance value achieved in the two cases is then associated with the same temperature, that is to say, the temperature that is reached in a factory-outlet glow plug when the specified first power is supplied. Since in the case of an aged glow plug a larger proportion of the power is dissipated directly at the glow plug tip, it can be assumed that an aged glow plug at the reduced power, which is less than the first power, nevertheless reaches the same end temperature at the glow plug tip.

Modern glow plug controls generally check during each heating procedure whether the resistance values measured on a glow plug match one or a plurality of stored values, as described, for example, in DE 10 2013 108 628 B4, DE 10 2010 040 682 A1 or U.S. Pat. No. 7,886,587 B2. In general, a deviation that exceeds a permissible level is interpreted that the resistance temperature characteristic stored for the engine cylinder, that is to say, for the glow plug mounted in the latter, is no longer valid, and a re-characterization of the glow plug must be carried out, that is to say, a resistance temperature characteristic must be determined for the glow plug in question.

In this context, an aged glow plug can be detected, for example, by the fact that a slow drift in the resistance values of the glow plug has been observed over a plurality of heating procedures, which drift ultimately exceeds a permissible level. Such a slow alteration of resistance values is typical for an ageing process. In order to observe such a drift, provision can be made for resistance measurements to be recorded during each characterization process and stored in a memory, such that a sequence of resistance values can be analysed so as to detect an aged glow plug. Likewise the number of requests for characterization can be stored with respect to the reset cycles that have taken place so far between the revised characterizations. If the plug in question still shows a permissible resistance drift, but is characterized again within 10 to 40 reset cycles, it has reached the end of its service life and must be regarded as defective.

Another way of detecting an aged glow plug as such is to provide two thresholds for a detected deviation when comparing the current resistance values with the stored resistance values, for example to detect a replacement of the glow plug. If the deviation only exceeds a first, lower threshold value, an aged glow plug is indicated. If the deviation also exceeds a second, higher threshold value, a glow plug replacement is assumed, i.e., a factory-outlet glow plug.

In an advantageous refinement of this disclosure, provision is made for the reduced power to be 5 to 15% less than the first power with which the resistance temperature characteristic of a factory-outlet glow plug is determined. Such a power reduction has proved its worth for aged glow plugs, which show a significant change in their resistance temperature characteristic curve, but can still be used. It is possible to treat all glow plugs detected as aged in the same manner when determining their resistance temperature characteristic, for example by heating them at a power that is 10% less than the first power with which the resistance temperature characteristic of a factory-outlet glow plug is determined. Another possibility is to differentiate between glow plugs in their degree of ageing and, for example, to heat glow plugs which have reached a first ageing stage in a characterization procedure at a power reduced by 5%, and to heat glow plugs of a second ageing stage at a power reduced by 15%.

The method of this disclosure can be used particularly advantageously in combination with a method for detecting a glow plug replacement, which can detect a replacement of individual glow plugs, i.e., when a single glow plug of an engine is replaced, it can detect that the remaining plugs have not been replaced and therefore do not require revised characterization.

Preferably not all plugs will be re-characterized during the characterization procedure. Although all plugs are activated during the characterization procedure, the old values are not overwritten. This specific revised characterization of one or a plurality of individual plugs thus protects the other plugs in the system, which no longer reach the values of a factory-outlet plug due to ageing and are therefore overloaded.

An advantage here is that if one plug fails, the rest of the system can continue to operate correctly. In conventional methods, one plug that cannot be characterized can lead to the failure of the entire system, for example if the glow plug with the reference value is defective using the method of known art from DE 10 2013 108 628 B4, or if the system is permanently re-characterized because a plug is repeatedly classified as a supposedly new glow plug. Conventional systems are not operated correctly in both cases, since the inability to characterize at least one plug usually leads to an emergency glow function of the entire system with subsequent re-characterization.

In contrast, the method of this disclosure enables the reliable operation of the detected and functional plugs in the system, and thus ensures a maximum starting capability of the engine.

Here, during the initialization procedure, i.e., a heating for purposes of a characterization procedure, a further check can be made as to whether a glow plug replacement has taken place. If during this procedure the glow plugs have again been detected, a characterization procedure is not necessary. If such a "healing" or a non-detection occurs more frequently, or at shorter intervals, on one or more cylinders, these glow plugs have undergone massive ageing and have reached the end of their service lives. The system can detect these and report them as defective.

In order to protect the glow plugs from ageing as much as possible, the old characteristic values of the glow plug concerned can be retained if a slight drift is detected. This has the positive effect that the glow plugs are subjected to less load. Although a slight loss of maximum temperature has to be accepted, the plug is protected to the maximum during its service life. Since ageing of a glow plug always leads to an increase in resistance, the resistance for 1200° C. can never decrease (except as a result of changes in the supply line to the plug or the engine). By maintaining the maximum resistance for 1200° C., the risk of overload can be minimized.

If only the glow plug control unit should be replaced, because the old one has a defect, but the plugs are retained, a re-characterization without previous values is absolutely necessary. The system therefore cannot detect whether aged or new plugs have been installed, because it has no history of the plugs. With the existing characterization procedure, all plugs would therefore be reprogrammed as new. Here the mechanic must be able to decide whether he has aged or new plugs in the engine. If he has aged plugs, this must lead to a "characterization procedure for used plugs" carried out by the tester. In the case in which all plugs have been replaced, this must lead to a "characterization procedure for new plugs" carried out by the tester.

While exemplary embodiments have been disclosed hereinabove, the present invention is not limited to the disclosed embodiments. Instead, this application is intended to cover any variations, uses, or adaptations of this disclosure using its general principles. Further, this application is intended to cover such departures from the present disclosure as come within known or customary practice in the art to which this invention pertains and which fall within the limits of the appended claims.

What is claimed is:

1. A method for determining the resistance temperature characteristic of a ceramic glow plug, comprising:
   determining whether the ceramic glow plug is an aged ceramic glow plug, and then;
   when the ceramic glow plug has not been determined to be an aged ceramic glow plug, heating the ceramic glow plug at a first specified power and associating the resistance value thereby obtained with a temperature that is anticipated to be the final temperature when heating a factory-outlet ceramic glow plug at said first specified power; or
   when the ceramic glow plug has been detected as an aged ceramic glow plug, heating the ceramic glow plug at a reduced power that is less than said first specified power and associating the resistance value thereby obtained with the same temperature as is anticipated when heating a factory-outlet ceramic glow plug at said first specified power.

2. The method according to claim 1, wherein the reduced power is 5 to 15% less than the first specified power.

3. The method according to claim 1, wherein the step of determining whether the ceramic glow plug is an aged ceramic glow plug comprises comparing an electrical resistance value measured before or during earlier heating procedures with a currently measured electrical resistance value.

4. The method according to claim 3, wherein an observed drift over a plurality of heating procedures reaching a threshold value is interpreted as a detection of an aged ceramic glow plug.

5. The method according to claim 3, wherein a deviation of a resistance value measured before or during heating from a resistance value measured before or during a previous heating procedure, which exceeds a first threshold value, but is smaller than a second threshold value, is interpreted as an indication of an aged ceramic glow plug and a deviation that also exceeds the second threshold value is regarded as an indication of a ceramic glow plug replacement.

6. The method according to claim 1, wherein the reduced power is further reduced compared to the first specified power, and the greater reduction in heating power is associated with greater ageing of the ceramic glow plug.

\* \* \* \* \*